United States Patent
He

(10) Patent No.: US 9,139,750 B2
(45) Date of Patent: Sep. 22, 2015

(54) HALOGEN-FREE RESIN COMPOSITION AND METHOD FOR PREPARATION OF COPPER CLAD LAMINATE WITH SAME

(75) Inventor: Yueshan He, Guangdong (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 14/239,045

(22) PCT Filed: Sep. 2, 2011

(86) PCT No.: PCT/CN2011/079273
§ 371 (c)(1),
(2), (4) Date: Feb. 14, 2014

(87) PCT Pub. No.: WO2013/029271
PCT Pub. Date: Mar. 7, 2013

(65) Prior Publication Data
US 2014/0150963 A1    Jun. 5, 2014

(51) Int. Cl.
| | |
|---|---|
| *C09D 163/10* | (2006.01) |
| *B32B 15/08* | (2006.01) |
| *C08K 5/5399* | (2006.01) |
| *C08K 5/00* | (2006.01) |
| *H05K 1/03* | (2006.01) |
| *B32B 37/10* | (2006.01) |
| *B32B 38/08* | (2006.01) |
| *C09D 143/02* | (2006.01) |
| *C09D 145/00* | (2006.01) |
| *C09D 171/12* | (2006.01) |
| *B32B 15/14* | (2006.01) |
| *B32B 15/20* | (2006.01) |
| *C08K 3/00* | (2006.01) |
| *H05K 3/02* | (2006.01) |

(52) U.S. Cl.
CPC .............. *C09D 163/10* (2013.01); *B32B 15/08* (2013.01); *B32B 15/14* (2013.01); *B32B 15/20* (2013.01); *B32B 37/10* (2013.01); *B32B 38/08* (2013.01); *C08K 5/0025* (2013.01); *C08K 5/5399* (2013.01); *C09D 143/02* (2013.01); *C09D 145/00* (2013.01); *C09D 171/12* (2013.01); *H05K 1/0346* (2013.01); *B32B 2260/023* (2013.01); *B32B 2260/046* (2013.01); *B32B 2262/101* (2013.01); *B32B 2305/076* (2013.01); *C08K 3/0033* (2013.01); *H05K 1/0373* (2013.01); *H05K 3/022* (2013.01); *H05K 2201/012* (2013.01); *H05K 2201/0209* (2013.01); *Y10T 156/1075* (2015.01)

(58) Field of Classification Search
CPC .. C09D 171/12; C09D 143/02; C09D 145/00; C09D 163/10; B32B 37/10; B32B 38/08; B32B 15/08; H05K 1/0346; H05K 1/0373; H05K 3/022; H05K 2201/012; H05K 2201/0209; C08K 5/0025; C08K 5/5399; C08K 3/0033; Y10T 156/1075
USPC .......... 524/444, 445, 448, 449, 451; 525/123, 525/131, 165, 178, 340, 390, 391, 395, 523, 525/528, 533
See application file for complete search history.

(56) References Cited

U.S. PATENT DOCUMENTS

| | | | |
|---|---|---|---|
| 2003/0148107 A1 | 8/2003 | Suzuki et al. | |
| 2011/0028584 A1 | 2/2011 | Cho et al. | |
| 2011/0030998 A1* | 2/2011 | Mizutani et al. | 174/254 |
| 2011/0045303 A1* | 2/2011 | He et al. | 428/418 |
| 2013/0284358 A1* | 10/2013 | He et al. | 156/256 |

FOREIGN PATENT DOCUMENTS

| | | |
|---|---|---|
| CN | 101995772 A | 3/2011 |
| CN | 102093666 A | 6/2011 |
| CN | 102134376 A | 7/2011 |
| CN | 102977551 | 3/2013 |
| EP | 0556844 A2 | 8/1993 |
| JP | 2002212450 A | 7/2002 |
| JP | 2011026513 A | 2/2011 |

OTHER PUBLICATIONS

EP Search Report cited in EP Application No. 11871425.2 dated Apr. 15, 2015.
Australian Patent Examination Report cited in Australian Application No. 2011376206 dated Jun. 13, 2014.
Nair et al, "Phosphazene-Triazine Polymers by Alder-ene Reaction", Polymer & Polymer Composites, vol. 12, No. 1, 2004, pp. 55-62.

* cited by examiner

*Primary Examiner* — Robert Jones, Jr.
(74) *Attorney, Agent, or Firm* — Workman Nydegger

(57) ABSTRACT

A halogen-free resin composition and a method for preparation of copper clad laminate with the same, wherein based on total parts by weight of solid components, the halogen-free resin composition comprises a reactive allyl phenoxy cyclotriphosphazene or vinyl phenoxy cyclotriphosphazene of 5-50 parts, a thermosetting resin of 15-85 parts, a crosslinking curing agent of 1-35 parts, a crosslinking curing accelerant of 0-5 parts and a filler of 0-100 parts. In the present invention, the reactive allyl phenoxy cyclotriphosphazene or vinyl phenoxy cyclotriphosphazene having very low water absorption is introduced into the thermosetting resin, satisfying both the halogen-free and antiflaming requirements and improving the electrical properties of the system, and making it possible to prepare the halogen-free high-frequency high-speed substrate material. The resulted copper clad laminate satisfies the halogen-free requirement, and has advantages such as excellent resistance to heat and moisture, and low dielectric loss.

20 Claims, No Drawings

HALOGEN-FREE RESIN COMPOSITION AND METHOD FOR PREPARATION OF COPPER CLAD LAMINATE WITH SAME

TECHNICAL FIELD

The present invention relates to a resin composition, especially a halogen-free resin composition and method for preparation of copper clad laminate with same.

BACKGROUND ART

Recently, electronic devices are continuously developed with the development of integrated technology, bonding technology and mounting technology of semiconductor devices used in wiring of electronic devices, high-density electronic packages and high-density printed circuit board. Especially, a rapid development thereof occurs in electronic devices using broadband, e.g. mobile communication devices.

As a component of such electronic devices, printed circuit board develops in a direction of a higher degree of multilayer printed circuit boards and more precise wiring. In order to increase the signal transmission speed to a level desired for speeding up the information processing, an effective way is to reduce the dielectric constant of the used materials. In order to reduce the transmission loss, an effective way is to use the materials having a lower dielectric loss tangent (dielectric loss).

While the electronic technology rapidly develops, people are pursuing environmental protection. However, the conventional high-frequency high speed materials basically use halides, antimonides and the like to achieve the object of flame retardance. When the halide-containing copper foil laminate is on fire and combusts, it will emit a great amount of smoke and an undesirable odor, as well hydrogen halide gas having a great toxicity and a strong causticity, which not only pollute the environment, but also endanger human health. Currently, the epoxy resins corresponding to the phosphorous-containing phenanthrene type compound DOPO or ODOPB are generally and industrially used to achieve the common FR-4 and the flame retardance. The phosphorous-containing phenanthrene type compound DOPO or ODOPB, however, still has a greater water absorption and a great effect on the dielectric constant and dielectric loss tangent.

CONTENTS OF THE INVENTION

The object of the present invention lies in providing a halogen-free resin composition, Another object of the present invention lies in providing a method for preparing copper clad laminate by using the halogen-free resin composition, said method being simple, wherein the produced copper clad laminate has the advantages of halogen-free, excellent heat resistance and moisture resistance and low dielectric loss.

In order to achieve said objects, the present invention provides a halogen-free resin composition, based on the total weight parts of the solid components, comprising
  from 5 to 50 parts by weight of reactive allylphenoxyl-cyclotriphosphazene or vinylcyclotriphosphazene;
  from 15 to 85 parts by weight of a thermosetting resin;
  from 1 to 35 parts by weight of a crosslinking curing agent;
  from 0 to 5 parts by weight of a crosslinking curing accelerator; and
  from 0 to 100 parts by weight of a packing.

Said reactive allylphenoxylcyclotriphosphazene or vinylcyclo-triphosphazene has the following structural formula (I)

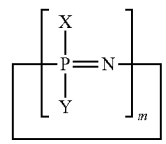

wherein m represents an integer of 3-25; X is phenoxyl

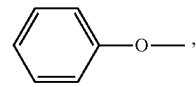

in an amount of 0-2m-1: Y is selected from the group consisting of p-allylphenoxyl

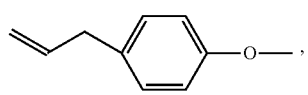

m-allylpheno

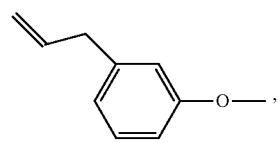

o-allyl-phenoxyl

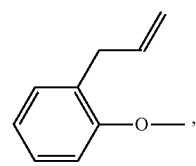

p-vinylphenoxyl

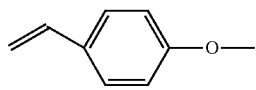

and m-vinylphenoxyl in an amount of 1-2m; X+Y=2m.

Said thermosetting resin comprises one or more of the following resins
  epoxy resins, including bisphenol A epoxy resin, bisphenol F epoxy resin, dicyclopentadiene epoxy resin, triphenolic epoxy resin, biphenyl-type epoxy resin, naphthol epoxy resin, and phosphorous-containing epoxy resin;

benzoxazine resin, including bisphenol A-type benzoxazine resin, bisphenol F-type benzoxazine resin, dicyclopentadiene-type benzoxazine resin and phenolphthalein-type benzoxazine resin;

cyanate resin, including bisphenol A-type cyanate resin, dicyclopentadiene-type cyanate resin and phenolic aldehyde-type cyanate resin;

bismaleimide resin, including 4,4'-diphenylmothane bismaleimide resin, allyl-modified diphenylmothane bismaleimide resin;

reactive polyphenylene oxide resin, having a number average molecular weight of 1000-7000, wherein the reactive groups is hydroxyl or double bond; and C5 hydrocarbon resin consisting of vinylbutylbenzene resin having a molecular weight of 11000, vinylpolybutadiene resin with polar groups and a copolymer in which butadiene is grafted to styrene with maleic anhydride.

Said crosslinking curing agent is selected from the group consisting of dicyandiamide, aromatic amine, anhydride, phenols, fulminuric triene ester and phosphorous-containing phenolic aldehyde, or combinations thereof.

Said crosslinking curing accelerator is selected from the group consisting of 2-methylimidazole, 2-ethyl-4-methylimidazole, 2-phenylimidazole, tri-(dimethylaminomethyl), hexamethylene tetramine, dicumyl peroxide, tert-butyl peroxybenzoate, 2,5-di(2-ethylcaproyl peroxy)-2,5-dimethylhexane, acetopyruvic salts, and caprilate, or combinations thereof.

Said packing is one or more selected from the group consisting of aluminium hydroxide, magnesium hydroxide, zeolite, wollastonite, silicon dioxide, magnesia, calcium silicate, calcium carbonate, clay, talc and mica. Further, the present invention provides a method for preparing a copper clad laminate with he halogen-free resin composition above, comprising Step 1: dissolving from 5 to 50 parts by weight of reactive allylphenoxycyclotriphosphazene or vinylphenoxycyclotriphosphazene in a solvent until complete dissolution at room temperature or moderate temperature;

Step 2: adding from 15 to 85 parts by weight of the corresponding thermosetting resin, form 1 to 35 parts by weight of a crosslinking curing agent, from 0 to 5 parts by weight of a crosslinking curing accelerator and from 0 to 100 parts by weight of a packing into said solution, homogeneously stirring to obtain a liquid cement;

Step 3: homogeneously coating with said liquid cement E-glass cloth having a flattening surface, and then baking to a B-stage prepreg;

Step 4: cutting the B-stage prepreg to a suitable size according to the press size, stacking several prepregs regularly, a copper foil being placed over and under the prepregs, pressing in a vacuum hot press to obtain a copper clad laminate.

She solvent is one or more selected from benzene and ketone solvents; said moderate temperature is ≤80° C.

During the step 3 of baking the B-stage prepreg, the temperature is set up according to the boiling point of the solvent used therein, and ranges from 85 to 175° C., and the baking lasts 5-20 min.

In step 4, the pressing process is carried out by the bench pressing method, comprising the specific steps of increasing from room temperature to 150° C. within 15 min and remaining for 30 min, then increasing to 180° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h and post-processing at 200-245° C. and remaining for 1-5 h.

The prevent invention has the following beneficial effects. The reactive allyl phenoxy cyclotriphosphazene or vinyl phenoxy cyclotriphosphazene having very low water absorption is introduced into the thermosetting resin, satisfying both the halogen-free and antiflaming requirements and improving the electrical properties of the system (decreasing and stabilizing Dk (dielectric constant) and Df (dielectric loss factor)), and making it possible to prepare the halogen-free high-frequency high-speed substrate material. The resulted copper clad laminate satisfies the halogen-free requirement, and has advantages such as excellent resistance to heat and moisture, and low dielectric loss.

Embodiments

The halogen-free resin composition of the present invention comprises, based on the total weight parts of the solid components, comprising from 5 to 50 parts by weight of reactive allylphenoxylcyclotriphosphazene or vinylcyclotriphosphazene;

from 15 to 85 parts by weight of a thermosetting resin;

from 1 to 35 parts by weight of a crosslinking curing agent;

from 0 to 5 parts by weight of a crosslinking curing accelerator; and from 0 to 100 parts by weight of a packing.

Said reactive allylphenoxylcyclotriphosphazene or vinylcyclo-triphosphazene has the following structural formula (I)

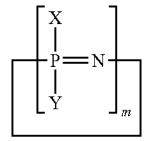

wherein m represents an integer of 3-25; X is phenoxyl in an amount of 0-2m-1: Y is selected from the group

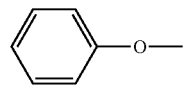

ing of p-allylphenoxyl

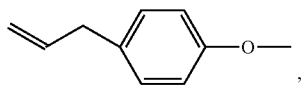

m-allylpheno

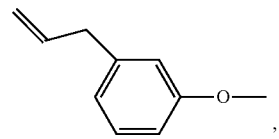

o-allyl-phenoxyl

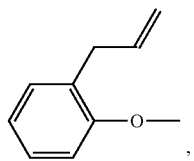

p-vinylphenoxyl

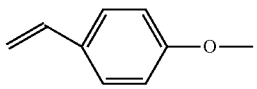

and m-vinylphenoxyl

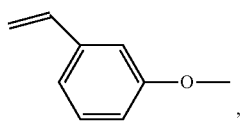

in an amount of 1-2m; X+Y=2m.

Said reactive allylphenoxylcyclotriphosphazene or vinyl-cyclo-triphoshazene is a phosphazene compound having very low water absorption. By reacting the reactive groups therein with the specific thermosetting resin, the present invention may satisfy the halogen-free and antiflaming requirements of the high-frequency high-speed material, without any effect on the excellent dielectric constant and dielectric loss tangent performance.

Said thermosetting resin comprises one or more of the following resins
    epoxy resins, including bisphenol A epoxy resin, bisphenol F epoxy resin, dicyclopentadiene (DCPD)epoxy resin, triphenolic epoxy resin, biphenyl-type epoxy resin, naphthol epoxy resin, and phosphorous-containing epoxy resin; benzoxazine resin, including bisphenol A-type benzoxazine resin, bisphenol F-type benzoxazine resin, dicyclopentadiene-type benzoxazine resin and phenolphthalein-type benzoxazine resin; cyanate resin, including bisphenol A-type cyanate resin, dicyclopentadiene-type cyanate resin and phenolic aldehyde-type cyanate resin; bismaleimide resin, including 4,4'-diphenylmothane bismaleimide resin, allyl-modified diphenylmothane bismaleimide resin; reactive polyphenylene oxide resin, having a number average molecular weight of 1000-7000, wherein the reactive groups is hydroxyl or double bond; and C5 hydrocarbon resin consisting of vinylbutylbenzene resin having a molecular weight of 11000, vinylpolybutadiene resin with polar groups and a copolymer in which butadiene is grafted to styrene with maleic anhydride.

Said crosslinking curing agent is selected from the group consisting of dicyandiamide, aromatic amine, anhydride, phenols, fulminuric triene ester and phosphorous-containing phenolic aldehyde, or combinations thereof.

Said crosslinking curing accelerator is selected from the group consisting of 2-methylimidazole, 2-ethyl-4-methylimidazole, 2-phenylimidazole, DMP-30 (tri-(dimethylaminomethyl)), hexamethylene tetramine, dicumyl peroxide, tert-butyl peroxybenzoate, 2,5-di(2-ethylcaproyl peroxy)-2,5-dimethylhexane, acetopyruvic salts, and caprilate, or combinations thereof.

Said packing is one or more selected from the group consisting of aluminium hydroxide, magnesium hydroxide, zeolite, wollastonite, silicon dioxide, magnesia, calcium silicate, calcium carbonate, clay, talc and mica. The amount of said inorganic packing may be adjusted according to the use purpose, and may be better from 0 to 100 parts by weight, most preferably from 25 to 100 parts by weight, based on the total amount of 100 parts by weight of the organic solids of the components in said halogen-free resin composition.

The aforesaid halogen-free resin composition is used to prepare prepregs, copper clad laminates and the like, wherein the fabricated prepregs include the substrate material and the halogen-free resin composition coated thereon; the substrate material is glass cloth, preferably E-glass cloth; the fabricated copper clad laminates include several stacked prepregs, and copper foils on one or both sides of the stacked prepregs. The resulted copper clad laminate satisfies the halogen-free requirement, and has advantages such as excellent resistance to heat and moisture, and low dielectric loss.

The method for preparing a copper clad laminate with he halogen-free resin composition above comprises the following steps:
    Step 1: dissolving from 5 to 50 parts by weight of reactive allylphenoxycyclotriphosphazene or vinylphenoxycyclotriphosphazene in a phenol or ketone solvent until complete dissolution at normal temperature or moderate temperature, wherein the solvent may be one or more phenol or ketone solvents; said normal temperature is the normal temperature in the prior art; the moderate temperature represents the temperature range of ≤80° C.;
    Step 2: adding from 15 to 85 parts by weight of the corresponding thermosetting resin, form 1 to 35 parts by weight of a crosslinking curing agent, from 0 to 5 parts by weight of a crosslinking curing accelerator and from 0 to 100 parts by weight of a packing into said solution, homogeneously stirring to obtain a liquid cement;
    Step 3: homogeneously coating with said liquid cement E-glass cloth having a flattening surface, and then baking to a B-stage prepreg, wherein during the process of baking the B-stage prepreg, the temperature is set up according to the boiling point of the solvent used therein, and ranges from 85 to 175° C., and the baking lasts 5-20 min;
    Step 4: cutting the B-stage prepreg to a suitable size according to the press size, stacking several prepregs regularly, a copper foil being placed over and under the prepregs, pressing in a vacuum hot press to obtain a copper clad laminate. In such step, the pressing process is carried out by the bench pressing method (step-by-step temperature-increasing and pressure-increasing), comprising the specific steps of increasing from room temperature to 150° C. within 15 min and remaining for 30 min, then increasing to 180° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h and post-processing at 200-245° C. and remaining for 1-5 h.

As for the fabricated copper clad laminate above, the dielectric constant, glass transition temperature, peeling strength, combustibility resistance, hygroscopicity and punching property thereof are measured, and further detailedly explained and described by the following examples.

The present invention is detailedly explained with the examples as follows, but not limited within the scope of the examples.

EXAMPLE 1

A solvent, hexachlorocyclotriphosphazene, allylphenol (containing o-allylphenol as the primary ingredient), and an acid-binding agent were added to a reaction device, stirred, protected by feeding nitrogen gas, and heated to 50-120° C. A catalyst was added to the reaction device to react for 5-16 h, then cool to room temperature and leach. The filtrate was distilled under pressure to evaporate the solvent to obtain a brown powder or viscous product. After 30 g of said product was dissolved in an organic solvent, 50 g of DCPD epoxy resin (which was HP-7200H (DIC), and had an equivalent of 275-280), 20 g of DCPD phenolic resin (which was Nihon Petro-chemical DPP-600 M), a suitable amount of imidazole and 2,5-(di(2-ethylcaproyl peroxy)) were added, homogeneously stirred to obtain a liquid cement. A flattening E-glass cloth having an area of 300×300 cm and a smooth surface was coated with said liquid cement, baked in an oven at 155° C. for 7 min to obtain a prepreg. 5 prepregs the rough edges of which were cut off were stacked, and copper foils having a thickness of 35 μm were attached on and under the prepregs and pressed in a vacuum hot press to obtain a copper clad laminate. The pressing process is carried out by the bench pressing method (step-by-step temperature-increasing and pressure-increasing), comprising increasing from room temperature to 150° C. within 15 min and remaining for 30 min, then increasing to 180° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h. The basic performances of the produced copper clad laminate are stated in Table 1 blow.

EXAMPLE 2

A solvent, hexachlorocyclotriphosphazene, allylphenol (containing o-allylphenol as the primary ingredient), and an acid-binding agent were added to a reaction device, stirred, protected by feeding nitrogen gas, and heated to 50-120° C. A catalyst was added to the reaction device to react for 5-16 h, then cool to room temperature and leach. The filtrate was distilled under pressure to evaporate the solvent to obtain a brown powder or viscous product. After 30 g of said product was dissolved in an organic solvent, 40 g of DCPD benzoxazine (which was MT36000 (Huntsman)), 20 g of DCPD epoxy resin (which was HP-7200H (DIC) and had an equivalent of 275-280), 10 g of styrene/maleic anhydride (said anhydride being EP-30, Sartomer), a suitable amount of imidazole and 2,5-(di(2-ethylcaproyl peroxy)) were added, homogeneously stirred to obtain a liquid cement. A flattening E-glass cloth having an area of 300×300 cm and a smooth surface was coated with said liquid cement, baked in an oven at 155° C. for 7 min to obtain a prepreg. 5 prepregs the rough edges of which were cut off were stacked, and copper foils having a thickness of 35 μm were attached on and under the prepregs and pressed in a vacuum hot press to obtain a copper clad laminate. The pressing process is carried out by the bench pressing method (step-by-step temperature-increasing and pressure-increasing), comprising increasing from room temperature to 150° C. within 15 min and remaining for 30 min, then increasing to 190° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h. The basic performances of the produced copper clad laminate are stated in Table 1 blow.

EXAMPLE 3

A solvent, hexachlorocyclotriphosphazene, allylphenol (containing o-allylphenol as the primary ingredient), and an acid-binding agent were added to a reaction device, stirred, protected by feeding nitrogen gas, and heated to 50-120° C. A catalyst was added to the reaction device to react for 5-16 h, then cool to room temperature and leach. The filtrate was distilled under pressure to evaporate the solvent to obtain a brown powder or viscous product. After 30 g of said product was dissolved in an organic solvent, 30 g of DPCP cyanate (which was LONZA-Primaset BADCy), 20 g of 4,4'-diphenylmothane bismaleimide resin, 20 g of DCPD epoxy resin (which was HP-7200H (DIC) and had an equivalent of 275-280), and a suitable amount of aluminum acetopyruvate were added, homogeneously stirred to obtain a liquid cement. A flattening E-glass cloth having an area of 300×300 cm and a smooth surface was coated with said liquid cement, baked in an oven at 155° C. for 7 min to obtain a prepreg. 5 prepregs the rough edges of which were cut off were stacked, and copper foils having a thickness of 35 μm were attached on and under the pregpregs and pressed in a vacuum hot press to obtain a copper clad laminate. The pressing process is carried out by the bench pressing method (step-by-step temperature-increasing and pressure-increasing), comprising increasing from room temperature to 150° C. within 15 min and remaining for 30 min, then increasing to 210° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h. The basic performances of the produced copper clad laminate are stated in Table 1 blow.

EXAMPLE 4

A solvent, hexachlorocyclotriphosphazene, allylphenol (containing o-allylphenol as the primary ingredient), and an acid-binding agent were added to a reaction device, stirred, protected by feeding nitrogen gas, and heated to 50-120° C. A catalyst was added to the reaction device to react for 5-16 h, then cool to room temperature and leach. The filtrate was distilled under pressure to evaporate the solvent to obtain a brown powder or viscous product. After 30 g of said product was dissolved in an organic solvent, 50 g of reactive polyphenylene oxide resin (which was MX9000, SABIC), 20 g of DCPD epoxy resin (which was HP-7200H (DIC) and had an equivalent of 275-280), a suitable amount of imidazole and 2,5-(di(2-ethylcaproyl peroxy)) were added, homogeneously stirred to obtain a liquid cement. A flattening E-glass cloth having an area of 300×300 cm and a smooth surface was coated with said liquid cement, baked in an oven at 155° C. for 7 min to obtain a prepreg. 5 prepregs the rough edges of which were cut off were stacked, and copper foils having a thickness of 35 μm were attached on and under the prepregs and pressed in a vacuum hot press to obtain a copper clad laminate. The pressing process is carried out by the bench pressing method (step-by-step temperature-increasing and pressure-increasing), comprising increasing from room temperature to 150° C. within 15 min and remaining for 30 min, then increasing to 190° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h. The basic performances of the produced copper clad laminate are stated in Table 1 blow.

COMPARISON EXAMPLE 1

A solvent, hexachlorocyclotriphosphazene, vinylphenol (a 50/50 mixture of p-vinylphenol and m-vinylphenol) and an acid-binding agent were added to a reaction device, stirred, protected by feeding nitrogen gas, and heated to 50-120° C. A catalyst was added to the reaction device to react for 5-16 h, then cool to room temperature and leach. The filtrate was distilled under pressure to evaporate the solvent to obtain a brown powder or viscous product. After 30 g of said product was dissolved in an organic solvent, 30 g of DPCP cyanate (which was LONZA-Primaset BADCy), 20 g of 4,4'-diphenylmothane bismaleimide resin, 20 g of DCPD epoxy resin (which was HP-7200H (DIC)) were added. The prepregs the rough edges of which were cut off were stacked, and copper foils having a thickness of 35 μm were attached on and under the prepregs and pressed in a vacuum hot press to obtain a copper clad laminate. The pressing process is carried out by the bench pressing method (step-by-step temperature-increasing and pressure-increasing), comprising increasing from room temperature to 150° C. within 15 min and remaining for 30 min, then increasing to 190° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h. The basic performances of the produced copper clad laminate are stated in Table 1 blow.

COMPARISON EXAMPLE 2

A solvent, hexachlorocyclotriphosphazene, vinylphenol (a 50/50 mixture of p-vinylphenol and m-vinylphenol) and an acid-binding agent were added to a reaction device, stirred, protected by feeding nitrogen gas, and heated to 50-120° C. A catalyst was added to the reaction device to react for 5-16 h, then cool to room temperature and leach. The filtrate was distilled under pressure to evaporate the solvent to obtain a brown powder or viscous product. After 30 g of said product was dissolved in an organic solvent, 50 g of reactive polyphenylene oxide resin (which was MX9000, SABIC), 20 g of DCPD epoxy resin (which was HP-7200H (DIC) and had an equivalent of 275-280), a suitable amount of imidazole and 2,5-(di(2-ethylcaproyl peroxy)) were added, homogeneously stirred to obtain a liquid cement. A flattening E-glass cloth having an area of 300×300 cm and a smooth surface was coated with said liquid cement, baked in an oven at 155° C. for 7 min to obtain a prepreg. 5 prepregs the rough edges of which were cut off were stacked, and copper foils having a thickness of 35 μm were attached on and under the prepregs and pressed in a vacuum hot press to obtain a copper clad laminate. The pressing process is carried out by the bench pressing method (step-by-step temperature-increasing and pressure-increasing), comprising increasing from room temperature to 150° C. within 15 min and remaining for 30 min, then increasing to 190° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h. The basic performances of the produced copper clad laminate are stated in Table 1 blow.

TABLE 1

| | Property Evaluation | | | | | |
|---|---|---|---|---|---|---|
| | Example 1 | Example 2 | Example 3 | Example 4 | Com. Exp. 1 | Com. Exp. 2 |
| Glass transition temperature Tg (° C., DMA) | 160-170 | 170-185 | 195-225 | 195-215 | 200-230 | 190-220 |
| Peeling strength (½ OZ, N/mm) | >1.4 | >1.4 | >1.0 | >1.0 | >1.0 | >1.0 |
| Combustibility (1.60 mm) | V-1 | V-0 | V-0 | V-0 | V-0 | V-0 |
| Dip-soldering resistance (stratification) | ○ | Δ | ○ | ○ | ○ | ○ |
| Hygroscopicity | 0.11 | 0.10 | 0.13 | 0.11 | 0.12 | 0.10 |
| Dielectric constant (RC50, 1 GHz) | 4.0 | 4.2 | 3.8 | 3.6 | 3.7 | 3.5 |
| Dielectric loss (RC50, 1 GHz) | 0.010 | 0.009 | 0.005 | 0.003 | 0.005 | 0.003 |
| T-300/min | >60 | >60 | >120 | >120 | >120 | >120 |
| Punching property | ○ | Δ | ○ | ○ | Δ | ○ |

The aforesaid properties are measured by the following methods.

(1) Glass transition temperature (Tg): measured according to the differential scanning calorimetry (DSC) as stipulated under IPC-TM-650 2.4.25.

(2) Combustibility resistance: measured according to UL 94 vertical firing method.

(3) Dip-soldering resistance: the sample (the substrate material of 100×100 mm) which remains in pressure processing device at 121° C. and 105 Kpa for 2 hours is impregnated in a solder bath heated to 260° C. for 20 seconds to visually observe (h1) whether there is stratification; (h2) whether there is white plague or wrinkling, wherein the symbol ○ in the table represents unchanged; the symbol Δ represents white plague; the symbol x represents stratification.

(4) Hygroscopicity: measured according to the method of IPC-TM-650 2.6.2.1.

(5) Dielectric Loss Factor: measured according to the resonance method using strip lines and IPC-TM-650 2.6.2.1.

(6) Punching property: the basis material having a thickness of 1.60 mm is placed on a punch die having a certain figure for punching to visually observe (h1) no bright border at the hole edge; (h2) bright border at the hole edge; (h3) cleavage of the hole edge, which are respectively represented with ○, Δ and x.

According to the results above, it can be seen that the present invention can satisfy both the halogen-free and anti-flaming requirements (halogen content falling within the scope required by the JPCA halogen-free requirements) without not reducing the dielectric performance, excellent resistance to heat, and better processability.

The aforesaid examples are not used to limit the content of the composition of the present invention. Any tiny amendment, equivalent change or modification to the aforesaid examples according to the technical essence of the present invention and the weight part or content of the composition still falls within the scope of the technical solution of the present invention.

The invention claimed is:

1. A halogen-free resin composition, comprising, based on the total weight parts of the solid components,
    from 5 to 50 parts by weight of reactive allylphenoxylcyclo-triphosphazene or vinylcyclotriphosphazene;
    from 15 to 85 parts by weight of a thermosetting resin;
    from 1 to 35 parts by weight of a crosslinking curing agent;
    from 0 to 5 parts by weight of a crosslinking curing accelerator; and
    from 0 to 100 parts by weight of a packing,
    wherein the solid components of the resin composition are devoid of benzoxazine.

2. The halogen-free resin composition according to claim 1, wherein said reactive allylphenoxylcyclotriphosphazene or vinylcyclotriphosphazene has the following structural formula (I)

$$\left[ \begin{matrix} X \\ | \\ P=N \\ | \\ Y \end{matrix} \right]_m$$

wherein m represents an integer of 3-25; X is phenoxyl

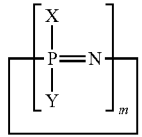,

Y is selected from the group consisting of p-allylphenoxyl

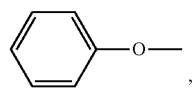, m-allylphenoxyl

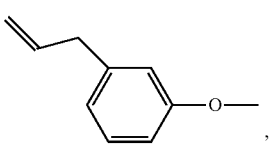, o-allyl-phenoxyl

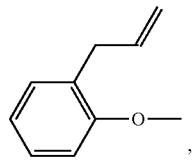, p-vinylphenoxyl

, and m-vinylphenoxyl

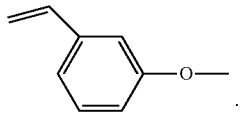.

3. The halogen-free resin composition according to claim 1, wherein said thermosetting resin comprises one or more of the following resins
    epoxy resins selected from the group consisting of bisphenol A epoxy resin, bisphenol F epoxy resin, dicyclopentadiene epoxy resin, triphenolic epoxy resin, biphenyl-type epoxy resin, naphthol epoxy resin, and phosphorous-containing epoxy resin;
    cyanate resin selected from the group consisting of bisphenol A-type cyanate resin, dicyclopentadiene-type cyanate resin and phenolic aldehyde-type cyanate resin;
    bismaleimide resin selected from the group consisting of 4,4'-diphenylmothane bismaleimide resin, allyl-modified diphenylmothane bismaleimide resin;
    reactive polyphenylene oxide resin, having a number average molecular weight of 1000-7000, wherein the reactive groups is hydroxyl or double bond; and
    C5 hydrocarbon resin selected from the group consisting of vinylbutylbenzene resin having a molecular weight of 11000, vinylpolybutadiene resin with polar groups and a copolymer in which butadiene is grafted to styrene with maleic anhydride.

4. The halogen-free resin composition according to claim 1, wherein said crosslinking curing agent is selected from the group consisting of dicyandiamide, aromatic amine, anhydride, phenols, fulminuric triene ester and phosphorous-containing phenolic aldehyde, or combinations thereof.

5. The halogen-free resin composition according to claim 1, wherein said crosslinking curing accelerator is selected from the group consisting of 2-methylimidazole, 2-ethyl-4- methylimidazole, 2-phenylimidazole, tri-(dimethylaminomethyl), hexamethylene tetramine, dicumyl peroxide, tert-butyl peroxybenzoate, 2,5-di(2-ethylcaproyl peroxy)-2,5-dimethylhexane, acetopyruvic salts, and caprilate, or combinations thereof.

6. The halogen-free resin composition according to claim 1, wherein said packing is one or more selected from the group consisting of aluminium hydroxide, magnesium hydroxide, zeolite, wollastonite, silicon dioxide, magnesia, calcium silicate, calcium carbonate, clay, talc and mica.

7. A method for preparing a copper clad laminate with the halogen-free resin composition according to claim 1, comprising
dissolving from 5 to 50 parts by weight of reactive allylphenoxycyclotriphosphazene or vinylphenoxycyclotriphosphazene in a solvent until dissolution at a temperature ≤80° C.;
adding from 15 to 85 parts by weight of the corresponding thermosetting resin, from 1 to 35 parts by weight of a crosslinking curing agent, from 0 to 5 parts by weight of a crosslinking curing accelerator and from 0 to 100 parts by weight of a packing into said solution, the solution being free of benzoxazine containing compounds, and stirring the solution to obtain a liquid cement;
coating a substrate with said liquid cement and then baking to a B-stage prepreg;
stacking one or more prepregs in alignment, a copper foil being placed adjacent to at least one side of the prepregs, and pressing in a vacuum hot press to obtain a copper clad laminate.

8. The method for preparing a copper clad laminate according to claim 7, wherein the solvent is one or more selected from benzene and ketone solvents; said temperature ≤80° C. being room temperature.

9. The method for preparing a copper clad laminate according to claim 7, wherein, during baking the B-stage prepreg, the temperature is set up according to the boiling point of the solvent used therein, and ranges from 85 to 175° C., and the baking lasts 5-20 min.

10. The method for preparing a copper clad laminate according to claim 7, wherein the pressing process is carried out by the bench pressing method, comprising the specific steps of increasing from room temperature to 150° C. within 15 min and remaining for 30 min, then increasing to 180° C. within 5 min and remaining for 2 h, finally decreasing to room temperature within 30 min; increasing the pressure from 0 to 0.6 Mpa within 1 min and remaining for 20 min, then increasing the pressure 1.0 Mpa within 1 min and remaining for 2.5 h and post-processing at 200-245° C. and remaining for 1-5 h.

11. The halogen-free resin composition according to claim 3, wherein said thermosetting resin is an epoxy resin selected from the group consisting of bisphenol A epoxy resin, bisphenol F epoxy resin, dicyclopentadiene epoxy resin, triphenolic epoxy resin, biphenyl-type epoxy resin, naphthol epoxy resin, and phosphorous-containing epoxy resin.

12. The halogen-free resin composition according to claim 3, wherein said thermosetting resin is a cyanate resin selected from the group consisting of bisphenol A-type cyanate resin, dicyclopentadiene-type cyanate resin and phenolic aldehyde-type cyanate resin.

13. The halogen-free resin composition according to claim 3, wherein said thermosetting resin is a bismaleimide resin selected from the group consisting of 4,4'-diphenylmothane bismaleimide resin, allyl-modified diphenylmothane bismaleimide resin.

14. The halogen-free resin composition according to claim 3, wherein said thermosetting resin is a reactive polyphenylene oxide resin, having a number average molecular weight of 1000-7000, wherein the reactive groups is hydroxyl or double bond.

15. The halogen-free resin composition according to claim 3, wherein said thermosetting resin is a C5 hydrocarbon resin selected from the group consisting of vinylbutylbenzene resin having a molecular weight of 11000, and vinylpolybutadiene resin with polar groups and a copolymer in which butadiene is grafted to styrene with maleic anhydride.

16. The halogen-free resin composition according to claim 1, wherein said packing is included in an amount from 25 to 100 parts by weight.

17. The method for preparing a copper clad laminate according to claim 7, wherein the substrate is an E-glass cloth having a flattening surface.

18. The method for preparing a copper clad laminate according to claim 7, wherein the copper foil being placed adjacent to at least one side of the prepregs includes a copper foil being placed over and under the prepregs.

19. The method for preparing a copper clad laminate according to claim 7, further comprising, prior to stacking one or more prepregs, cutting the B-stage prepreg to a size according to the press size.

20. A halogen-free resin composition, comprising, based on the total weight parts of the solid components,
from 5 to 50 parts by weight of reactive allylphenoxylcyclo-triphosphazene or vinylcyclotriphosphazene;
from 15 to 85 parts by weight of a thermosetting resin, the thermosetting resin being selected from the group consisting of epoxy resins, cyanate resins, bismaleimide resins, reactive polyphenylene oxide resins, and C5 hydrocarbon resins;
from 1 to 35 parts by weight of a crosslinking curing agent selected from the group consisting of dicyandiamide, aromatic amine, anhydride, phenols, fulminuric triene ester and phosphorous-containing phenolic aldehyde, or combinations thereof;
from 0 to 5 parts by weight of a crosslinking curing accelerator selected from the group consisting of 2-methylimidazole, 2-ethyl-4-methylimidazole, 2-phenylimidazole, tri-(dimethylaminomethyl), hexamethylene tetramine, dicumyl peroxide, tert-butyl peroxybenzoate, 2,5-di(2-ethylcaproyl peroxy)-2,5-dimethylhexane, acetopyruvic salts, and caprilate, or combinations thereof; and
from 25 to 100 parts by weight of a packing selected from the group consisting of aluminium hydroxide, magnesium hydroxide, zeolite, wollastonite, silicon dioxide, magnesia, calcium silicate, calcium carbonate, clay, talc and mica;
wherein the solid components of the resin composition are devoid of benzoxazine.

* * * * *